United States Patent
Liu et al.

(10) Patent No.: US 9,543,233 B2
(45) Date of Patent: Jan. 10, 2017

(54) CHIP PACKAGE HAVING A DUAL THROUGH HOLE REDISTRIBUTION LAYER STRUCTURE

(71) Applicant: XINTEC INC., Taoyuan (TW)

(72) Inventors: Chien-Hung Liu, New Taipei (TW); Ying-Nan Wen, Hsinchu (TW); Shih-Yi Lee, Taoyuan (TW); Ho-Yin Yiu, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/869,602

(22) Filed: Sep. 29, 2015

(65) Prior Publication Data

US 2016/0133544 A1    May 12, 2016

Related U.S. Application Data

(60) Provisional application No. 62/078,876, filed on Nov. 12, 2014.

(51) Int. Cl.

| H01L 23/48 | (2006.01) |
|---|---|
| H01L 23/31 | (2006.01) |
| H01L 23/52 | (2006.01) |
| H01L 23/00 | (2006.01) |
| H01L 23/528 | (2006.01) |
| H01L 21/683 | (2006.01) |
| H01L 21/768 | (2006.01) |

(52) U.S. Cl.
CPC ........... *H01L 23/481* (2013.01); *H01L 21/268* (2013.01); *H01L 21/304* (2013.01); *H01L 21/3105* (2013.01); *H01L 21/561* (2013.01); *H01L 21/6835* (2013.01); *H01L 21/76898* (2013.01); *H01L 21/78* (2013.01); *H01L 23/3114* (2013.01); *H01L 23/528* (2013.01); *H01L 24/05* (2013.01); *H01L 24/43* (2013.01);

(Continued)

(58) Field of Classification Search
CPC .. H01L 23/481; H01L 23/3107; H01L 23/528; H01L 24/05; H01L 24/43
See application file for complete search history.

(56) References Cited

U.S. PATENT DOCUMENTS 8,263,439 B2 * 9/2012 Marimuthu ........... H01L 21/565
257/724
8,395,267 B2 * 3/2013 Roozeboom ........ H01L 21/4846
257/668

(Continued)

FOREIGN PATENT DOCUMENTS

| TW | 201349362 | 12/2013 |
| TW | 201428946 | 7/2014 |
| TW | 201432865 | 8/2014 |

*Primary Examiner* — Ida M Soward
(74) *Attorney, Agent, or Firm* — Liu & Liu

(57) ABSTRACT

A chip package includes a chip, a laser stopper, an isolation layer, a redistribution layer, an insulating layer, and a conductive structure. The chip has a conductive pad, a first surface, and a second surface opposite to the first surface. The conductive pad is located on the first surface. The second surface has a first though hole to expose the conductive pad. The laser stopper is located on the conductive pad. The isolation layer is located on the second surface and in the first though hole. The isolation layer has a third surface opposite to the second surface. The isolation layer and the conductive pad have a second though hole together, such that the laser stopper is exposed through the second though hole. The redistribution layer is located on the third surface, the sidewall of the second though hole, and the laser stopper.

9 Claims, 7 Drawing Sheets

(51) Int. Cl.
*H01L 21/268* (2006.01)
*H01L 21/78* (2006.01)
*H01L 21/304* (2006.01)
*H01L 21/3105* (2006.01)
*H01L 21/56* (2006.01)

(52) U.S. Cl.
CPC .......... *H01L 23/3107* (2013.01); *H01L 24/45* (2013.01); *H01L 2221/6834* (2013.01); *H01L 2221/68327* (2013.01); *H01L 2224/0231* (2013.01); *H01L 2224/0233* (2013.01); *H01L 2224/02371* (2013.01); *H01L 2224/02372* (2013.01); *H01L 2224/04042* (2013.01); *H01L 2224/13024* (2013.01); *H01L 2224/13025* (2013.01); *H01L 2224/432* (2013.01); *H01L 2224/45144* (2013.01); *H01L 2924/01079* (2013.01)

(56) References Cited

U.S. PATENT DOCUMENTS

| | | | | |
|---|---|---|---|---|
| 8,466,062 B2* | 6/2013 | Lu | ................ | H01L 21/76898 257/E21.577 |
| 8,710,680 B2* | 4/2014 | Chang | ................ | H01L 23/481 257/784 |
| 8,872,196 B2* | 10/2014 | Lee | ................ | H01L 31/12 257/82 |
| 8,883,561 B2* | 11/2014 | Park | ................ | H01L 21/4846 257/724 |
| 9,087,835 B2* | 7/2015 | Sutardja | ................ | H01L 23/49822 |
| 9,312,225 B2* | 4/2016 | Chang | ................ | H01L 21/6835 |
| 2008/0277799 A1* | 11/2008 | Benson | ................ | H01L 21/76898 257/774 |
| 2009/0283898 A1* | 11/2009 | Janzen | ................ | H01L 21/76898 257/698 |
| 2013/0075898 A1* | 3/2013 | Pratt | ................ | H01L 23/481 257/737 |
| 2014/0327105 A1* | 11/2014 | Ramachandran | ... | H01L 27/0814 257/499 |
| 2014/0339707 A1* | 11/2014 | Lin | ................ | H01L 23/3677 257/774 |
| 2015/0041980 A1* | 2/2015 | Ahn | ................ | H01L 24/94 257/738 |
| 2015/0122042 A1* | 5/2015 | Lin | ................ | B23P 19/04 73/754 |
| 2016/0181157 A1* | 6/2016 | Yu | ................ | H01L 24/05 438/108 |

* cited by examiner

US 9,543,233 B2

CHIP PACKAGE HAVING A DUAL THROUGH HOLE REDISTRIBUTION LAYER STRUCTURE

RELATED APPLICATIONS

This application claims priority to U.S. provisional Application Ser. No. 62/078,876, filed Nov. 12, 2014, which is herein incorporated by reference.

BACKGROUND

Field of Invention

The present invention relates to a chip package and a manufacturing method of the chip package.

Description of Related Art

A finger print sensor or an RF sensor needs to use a flat sensing surface to detect signals. If the flat sensing surface is not flat, the detecting accuracy of the sensor will be affected. For example, when a finger presses an uneven sensing surface of a sensor, it is difficult to detect an entire finger print for the sensor.

Furthermore, in manufacture of the aforesaid sensor, a through silicon via (TSV) is formed in a wafer to expose a conductive pad of the wafer. Thereafter, a chemical vapor deposition (CVD) method is performed on the conductive pad and the sidewall of the through silicon via to form a isolation layer. Next, a patterning process is further performed on the isolation layer that is on the conductive pad to form an opening. In general, the patterning process includes exposure, development, and etching processes. In a subsequent process, a redistribution layer can be formed on the isolation layer and electrically connected to the conductive pad that is in the opening of the isolation layer.

However, the chemical vapor deposition and the patterning processes both take a lot of process time and require a substantial cost of equipment.

SUMMARY

An aspect of the present invention is to provide a chip package.

According to an embodiment of the present invention, a chip package includes a chip, a laser stopper, an isolation layer, a redistribution layer, an insulating layer, and a conductive structure. The chip has a conductive pad, a first surface, and a second surface opposite to the first surface. The conductive pad is located on the first surface, and the second surface has a first through hole to expose the conductive pad. The laser stopper is located on the conductive pad. The isolation layer is located on the second surface and in the first though hole, and has a third surface opposite to the second surface. The isolation layer and the conductive pad have a second though hole together, such that the laser stopper is exposed through the second though hole. The redistribution layer is located on the third surface, a sidewall of the second though hole, and the laser stopper that is in the second though hole. The insulating layer is located on the third surface and the redistribution layer, and has an opening for exposing the redistribution layer. The conductive structure is located on the redistribution layer that is in the opening of the insulating layer, such that the conductive structure is electrically connected to the conductive pad.

Another aspect of the present invention is to provide a manufacturing method of a chip package.

According to an embodiment of the present invention, a manufacturing method of a chip package includes the following steps. (a) A wafer and a laser stopper are provided. The chip has a conductive pad, a first surface, and a second surface opposite to the first surface. The conductive pad is located on the first surface, and the laser stopper is located on the conductive pad. (b) A support element is temporarily bonded to the first surface of the wafer. (c) A first though hole is formed in the second surface of the wafer, such that the conductive pad is exposed through the first though hole. (d) An isolation layer is formed on the second surface of the wafer and in the first though hole. The isolation layer has a third surface opposite to the second surface. (e) A laser is used for penetrating the isolation layer and the conductive pad and forming a second though hole. The laser is shielded by the laser stopper, and the laser stopper is exposed through the second though hole. (f) A redistribution layer is electroplated on the third surface of the isolation layer, a sidewall of the second though hole, and the laser stopper that is in the second though hole.

In the aforementioned embodiments of the present invention, the laser stopper is located on the conductive pad. Hence, when a laser penetrates the isolation layer and the conductive pad, the laser can be shielded by the laser stopper, and the second though hole exposing the laser stopper is formed in the isolation layer and the conductive pad. After the second though hole is formed, the redistribution layer can be electroplated on the third surface of the isolation layer, the sidewall of the second though hole, and the laser stopper that is in the second though hole. The sidewall of the second though hole includes the surfaces of the conductive pad and the isolation layer, such that the redistribution layer can be electrically connected to the conductive pad. The chip package and the manufacturing method thereof in the present invention can omit a typical chemical vapor deposition (CVD) process and a typical pattering process for the isolation layer, thereby saving process time and reducing the cost of equipment. Moreover, no additional process is performed on the first surface of the chip, so that the flatness of the first surface of the chip is good, and the detecting accuracy of the chip package is improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
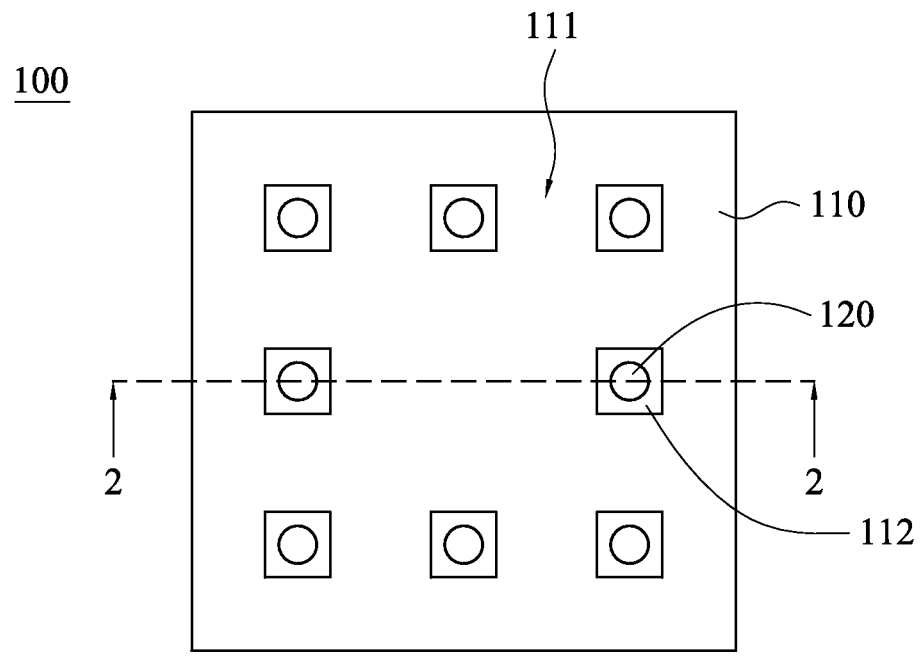
FIG. 1 is a top view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
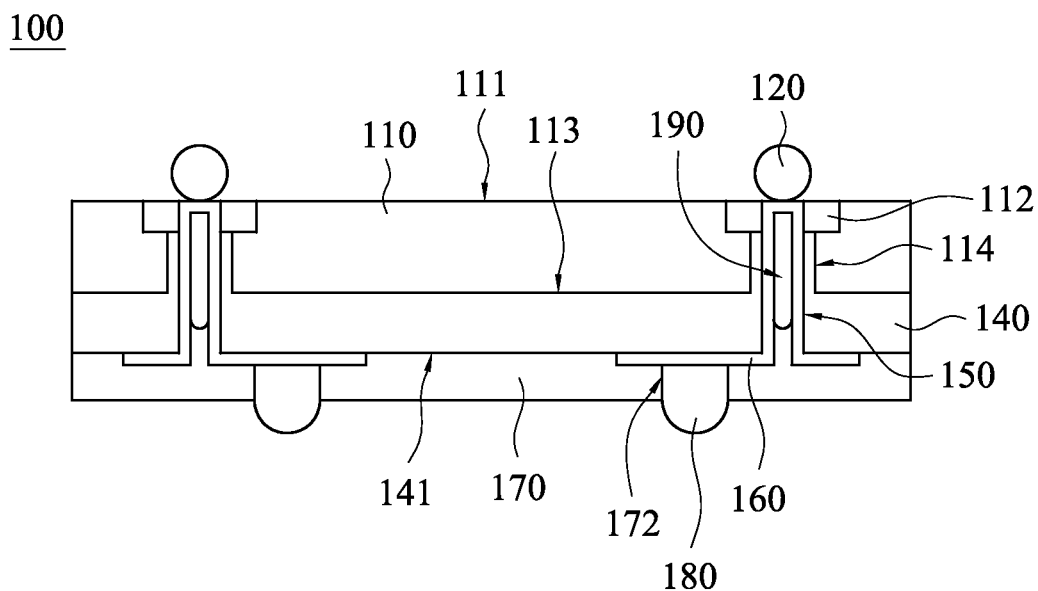
FIG. 2 is a cross-sectional view of the chip package taken along line 2-2 shown in FIG. 1.

FIG. 1 is a top view of a chip package 100 according to one embodiment of the present invention. FIG. 2 is a cross-sectional view of the chip package 100 taken along line 2-2 shown in FIG. 1. As shown in FIG. 1 and FIG. 2, the chip package 100 includes a chip 110, a laser stopper 120, an isolation layer 140, a redistribution layer 160 (RDL), an insulating layer 170, and a conductive structure 180. The chip 110 has a conductive pad 112, a first surface 111, and a second surface 113 opposite to the first surface 111. The first surface 111 is a sensing surface. The conductive pad 112 is located on the first surface 111. The second surface 113 has a first through hole 114, such that the conductive pad 112 is exposed through the conductive pad 112. The laser stopper 120 is located on the conductive pad 112. The isolation layer 140 is located on the second surface 113 of the chip 110 and in the first though hole 114, and has a third surface 141 opposite to the second surface 113. The isolation layer 140 and the conductive pad 112 have a second though hole 150 together, such that the laser stopper 120 is exposed through the second though hole 150. The redistribution layer 160 is located on the third surface 141 of the isolation layer 140, the sidewall of the second though hole 150, and the laser stopper 120 that is in the second though hole 150. The insulating layer 170 is located on the third surface 141 of the isolation layer 140 and the redistribution layer 160. The insulating layer 170 has an opening 172, such that the redistribution layer 160 is exposed through the opening 172 of the insulating layer 170. The conductive structure 180 is located on the redistribution layer 160 that is in the opening 172, such that the conductive structure 180 is electrically connected to the conductive pad 112 through the redistribution layer 160.

In this embodiment, the chip package 100 may be, but not limited to a finger print sensor or a RF sensor. The chip 110 may be made of a material including silicon. The laser stopper 120 may be made of a material including gold, such as a gold ball. The redistribution layer 160 be made of a material including copper, and may be formed by electroplating. The isolation layer 140 may be made of a material including epoxy.

Figure 3:
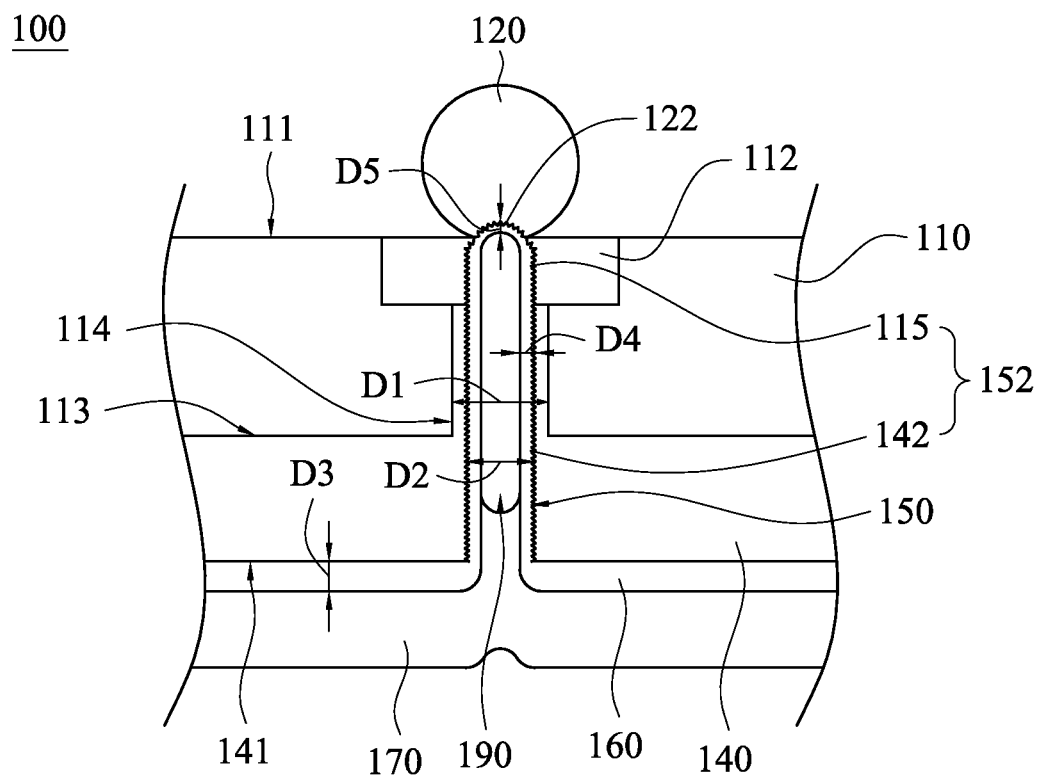
FIG. 3 is a partially enlarged view of the chip package shown in FIG. 2.

FIG. 3 is a partially enlarged view of the chip package 100 shown in FIG. 2. The laser stopper 120 has a fourth surface 122 that faces the redistribution layer 160. The second though hole 150 may be formed by utilizing a laser to penetrate the isolation layer 140 and the conductive pad 112. Through the use of the laser, the diameter D2 of the second though hole 150 may be smaller than the diameter D1 of the first though hole 114, which is helpful to miniaturization design. Since the second though hole 150 is formed by the laser, the sidewall 152 of the second though hole 150 and the fourth surface 122 of the laser stopper 120 both are rough surfaces. The sidewall 152 of the second though hole 150 includes the surface 115 of the conductive pad 112 and the surface 142 of the isolation layer 140. That is to say, the sidewall 152 is the surface of the conductive pad 112 and the isolation layer 140 facing the second though hole 150.

The laser stopper 120 is located on the conductive pad 112. Hence, when a laser penetrates the isolation layer 140 and the conductive pad 112, the laser can be shielded by the laser stopper 120, and the second though hole 150 exposing the laser stopper 120 is formed in the isolation layer 140 and the conductive pad 112. After the second though hole 150 is formed, the redistribution layer 160 may be formed on the third surface 141 of the isolation layer 140, the sidewall 152 of the second though hole 150, and the laser stopper 120 that is in the second though hole 150 through electroplating and electroless plating, such that the redistribution layer 160 can be electrically connected to the conductive pad 112.

Moreover, since the redistribution layer 160 is formed by electroplating, the thickness D3 of the redistribution layer 160 on the third surface 141 of the isolation layer 140 is greater than the thickness D4 of the redistribution layer 160 on the sidewall 152 of the second though hole 150, and the thickness D4 of the redistribution layer 160 on the sidewall 152 of the second though hole 150 is greater than the thickness D5 of the redistribution layer 160 on the laser stopper 120. In this embodiment, the chip package 100 further has a cavity 190. The cavity 190 is between the insulating layer 170 and the redistribution layer 160 that is in the second though hole 150.

In the following description, the manufacturing method of the chip package 100 will be described.

Figure 4:
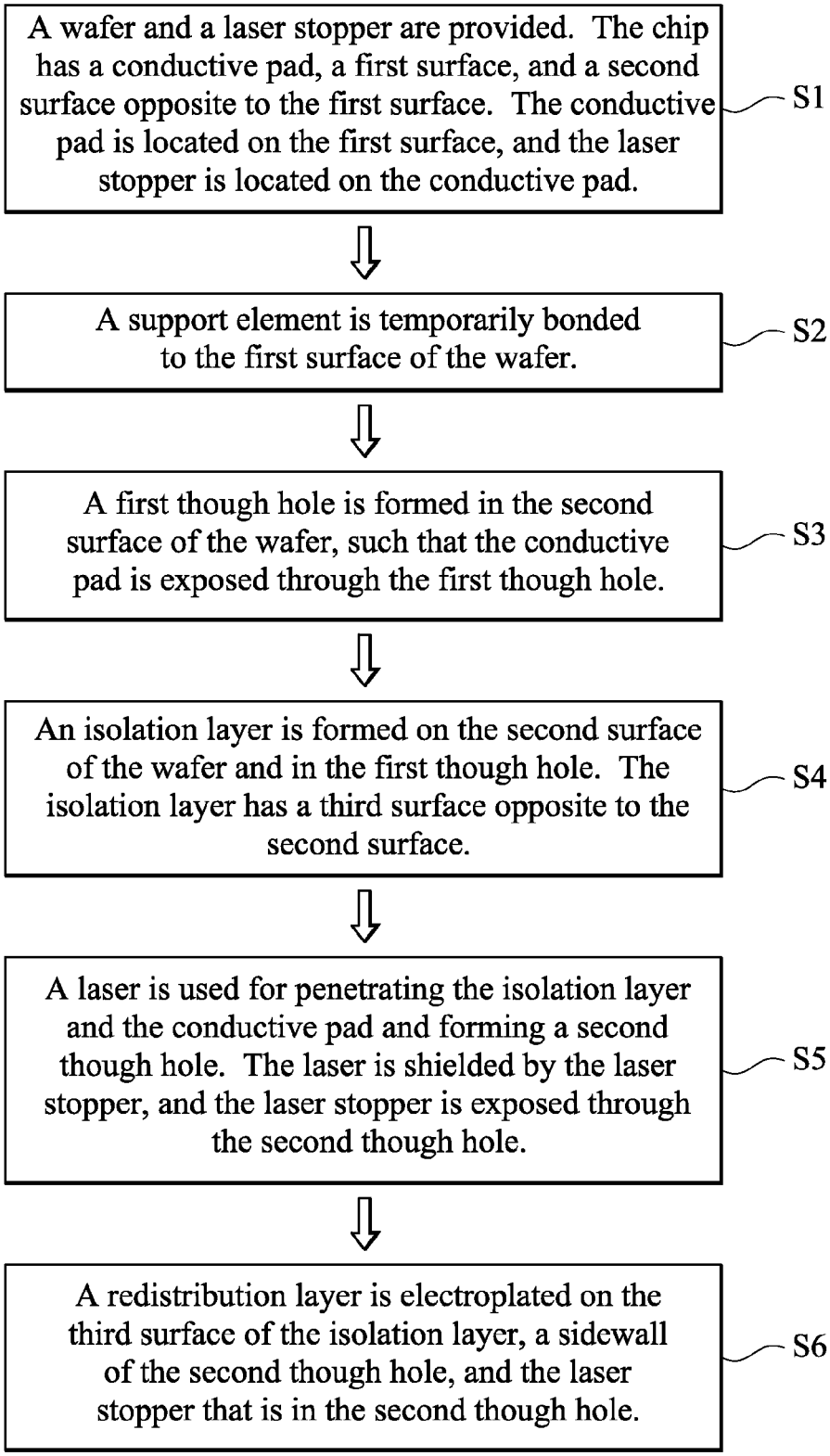
FIG. 4 is a flow chart of a manufacturing method of a chip package according to one embodiment of the present invention.

FIG. 4 is a flow chart of a manufacturing method of a chip package according to one embodiment of the present invention. The manufacturing method of the chip package includes the following steps. In step S1, a wafer and a laser stopper are provided. The chip has a conductive pad, a first surface, and a second surface opposite to the first surface. The conductive pad is located on the first surface, and the laser stopper is located on the conductive pad. Thereafter in step S2, a support element is temporarily bonded to the first surface of the wafer. Subsequently in step S3, a first though hole is formed in the second surface of the wafer, such that the conductive pad is exposed through the first though hole. Next in step S4, an isolation layer is formed on the second surface of the wafer and in the first though hole. The isolation layer has a third surface opposite to the second surface. Thereafter in step S5, a laser is used for penetrating the isolation layer and the conductive pad and forming a second though hole. The laser is shielded by the laser stopper, and the laser stopper is exposed through the second though hole. Finally in step S6, a redistribution layer is electroplated on the third surface of the isolation layer, a sidewall of the second though hole, and the laser stopper that is in the second though hole. In the following description, the aforesaid steps will be described.

Figure 5:
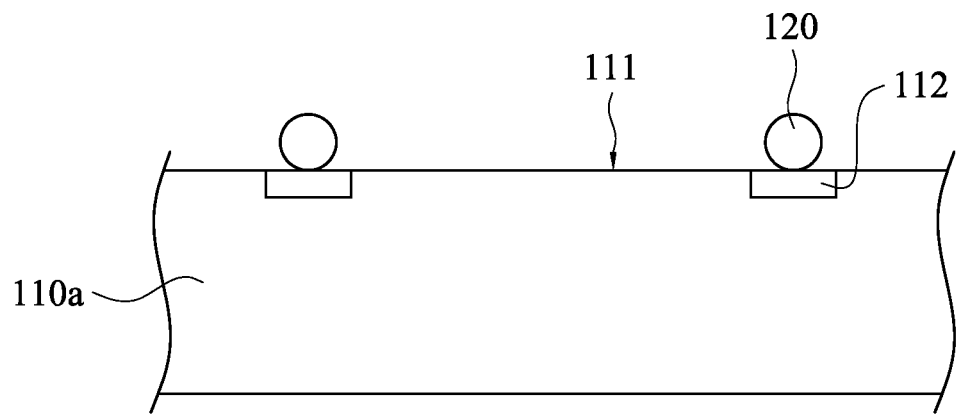
FIG. 5 is a cross-sectional view of a wafer and a laser stopper according to one embodiment of the present invention.

FIG. 5 is a cross-sectional view of a wafer 110a and the laser stopper 120 according to one embodiment of the present invention. The wafer 110a is a semiconductor substrate that may be cut to form plural chips 110 shown in FIG.

2. First of all, the wafer 110a and the laser stopper 120 may be provided. The chip 110a has the conductive pad 112, the first surface 111, and the second surface 113 opposite to the first surface 111. The conductive pad 112 is located on the first surface 111, and the laser stopper 120 is located on the conductive pad 112. In this embodiment, a wire (e.g., a gold wire) may be bonded to the conductive pad 112 of the wafer 110a. Afterwards, a portion the wire is cut out, such that the other portion of the wire left on the conductive pad 112 of the wafer 110a is to be the laser stopper 120, such as a gold ball.

Figure 6:
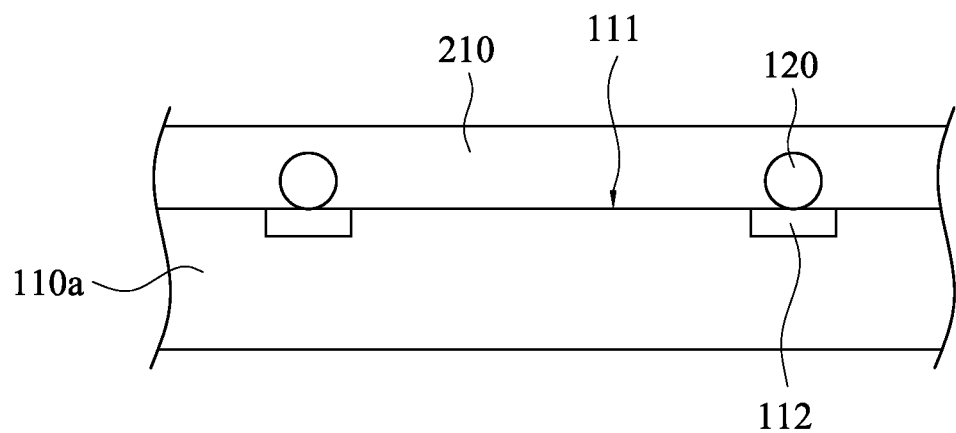
FIG. 6 is a cross-sectional view of a support element after being bonded to the wafer shown in FIG. 5.

FIG. 6 is a cross-sectional view of a support element 210 after being bonded to the wafer 110a shown in FIG. 5. As shown in FIG. 5 and FIG. 6, after the structure of FIG. 5 is formed, the support element 210 may be temporarily bonded to the first surface 111 of the wafer 110a. The support element 210 can provide a supporting force for the wafer 110a, and prevents the wafer 110a from being cracked in the subsequent manufacturing process. After the support element 210 is bonded to the wafer 110a, the second surface 113 of the wafer 110a may be ground to reduce the thickness of the wafer 110a.

Figure 7:
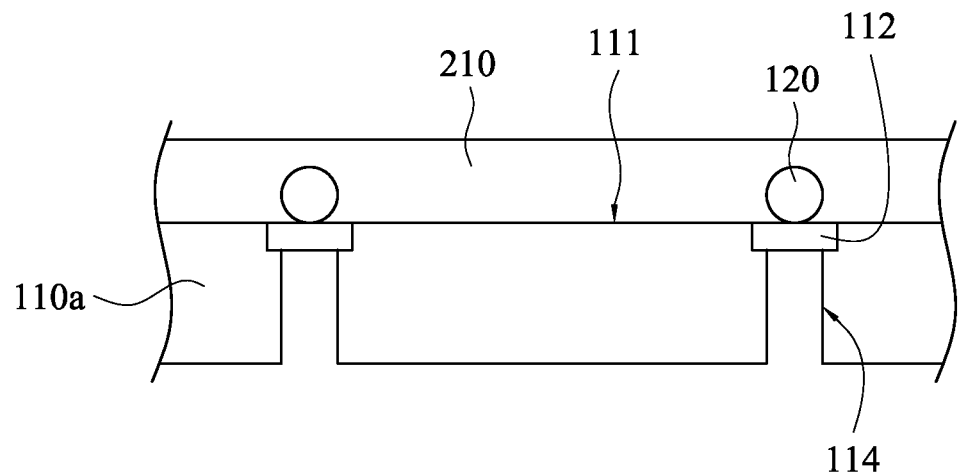
FIG. 7 is a cross-sectional view of a first though hole after being formed in the wafer shown in FIG. 6.

FIG. 7 is a cross-sectional view of the first though hole 114 after being formed in the wafer 110a shown in FIG. 6. As shown in FIG. 6 and FIG. 7, thereafter, the first though hole 114 may be formed in the second surface 113 of the wafer 110a, such that the conductive pad 112 is exposed through the first though hole 114. In this step, an etching process (e.g., a dry-etching process) may be performed on the wafer 110a to form the first though hole 114.

Figure 8:
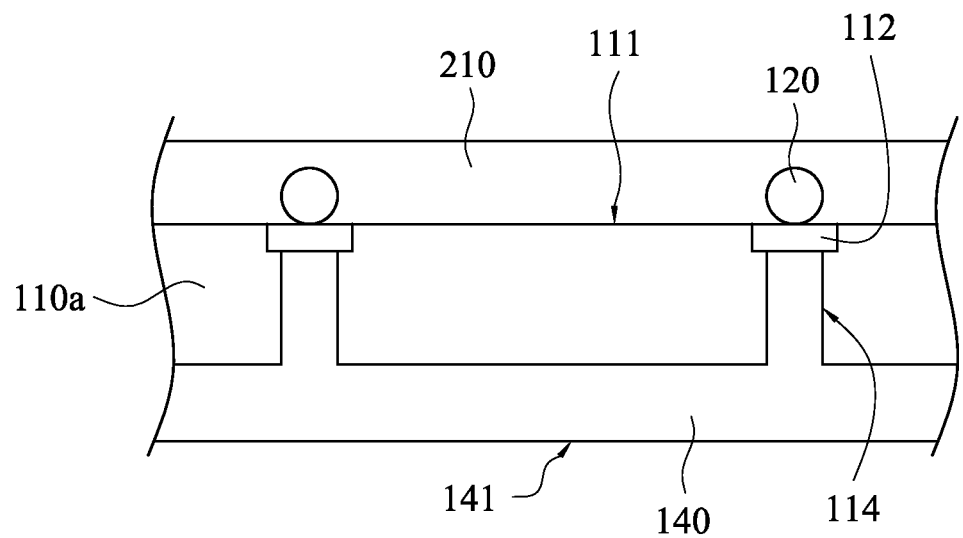
FIG. 8 is a cross-sectional view of an isolation layer after being formed on the second surface of the wafer and in the first though hole shown in FIG. 7.

FIG. 8 is a cross-sectional view of the isolation layer 140 after being formed on the second surface 113 of the wafer 110a and in the first though hole 114 shown in FIG. 7. As shown in FIG. 7 and FIG. 8, after the first though hole 114 is formed, the isolation layer 140 may be formed on the second surface 113 of the wafer 110a and in the first though hole 114. The isolation layer 140 has the third surface 141 opposite to the second surface 113. In this step, the isolation layer 140 may be printed on the second surface 113 of the wafer 110a and in the first though hole 114. Thereafter, coating, stamping, molding, or grinding the third surface 141 of the isolation layer 140 as deemed necessary by designers can reduce the thickness of the isolation layer 140.

Figure 9:
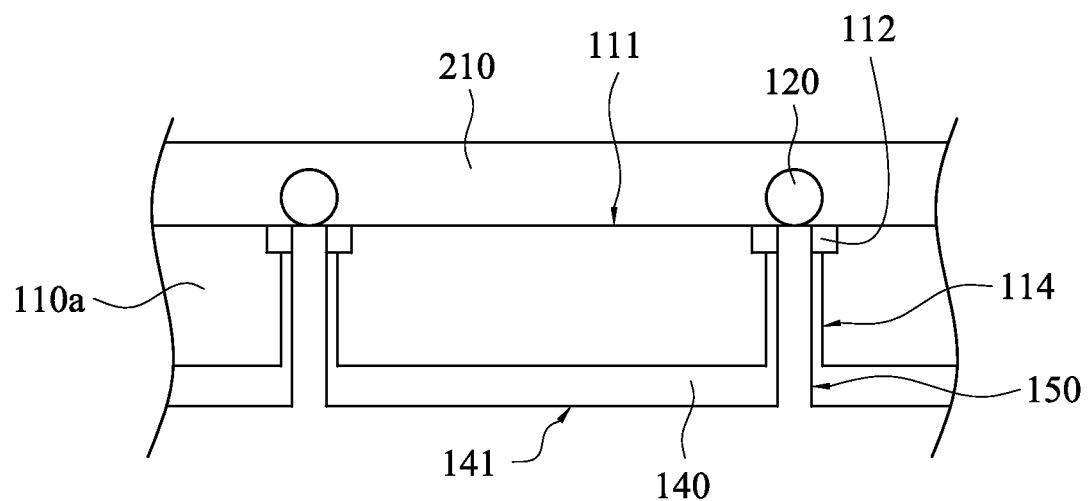
FIG. 9 is a cross-sectional view of a second though hole after being formed in the isolation layer and a conductive pad shown in FIG. 8.

FIG. 9 is a cross-sectional view of the second though hole 150 after being formed in the isolation layer 140 and the conductive pad 112 shown in FIG. 8. As shown in FIG. 8 and FIG. 9, after the structure of FIG. 8 is formed, a laser may be used to penetrate the isolation layer 140 and the conductive pad 112 and form the second though hole 150. The laser can be shielded by the laser stopper 120 that is on the conductive pad 112, such that the laser stopper 120 is exposed through the second though hole 150. Moreover, the laser is aligned with the first though hole 114 and the laser stopper 120 to irradiate, so that the second though hole 150 is surrounded by the first though hole 114.

Figure 10:
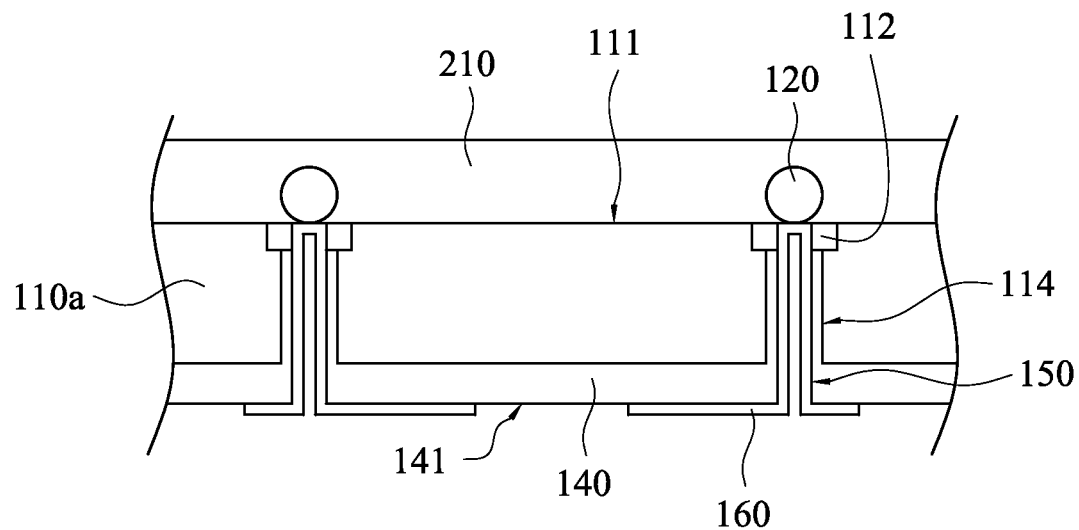
FIG. 10 is a cross-sectional view of a redistribution layer after being formed on the third surface of the isolation layer, the sidewall of the second though hole, and the laser stopper shown in FIG. 9.

FIG. 10 is a cross-sectional view of the redistribution layer 160 after being formed on the third surface 141 of the isolation layer 140, the sidewall of the second though hole 150, and the laser stopper 120 shown in FIG. 9. As shown in FIG. 9 and FIG. 10, after the second though hole 150 is formed in the isolation layer 140 and the conductive pad 112, the redistribution layer 160 may be electroplated on the third surface 141 of the isolation layer 140, the sidewall of the second though hole 150, and the laser stopper 120 that is in the second though hole 150.

Figure 11:
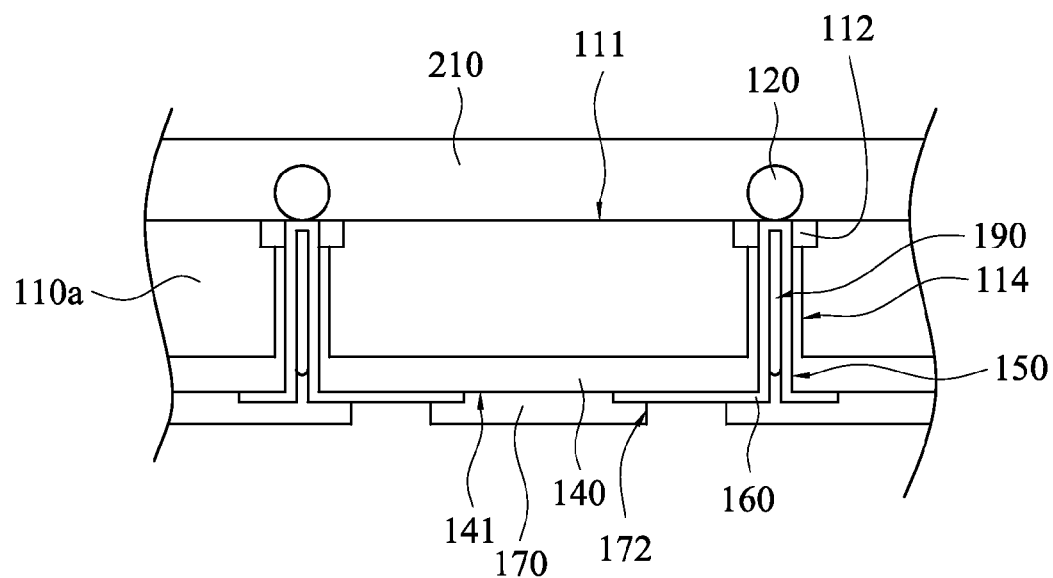
FIG. 11 is a cross-sectional view of an insulating layer after being formed on the isolation layer and the redistribution layer shown in FIG. 10.

FIG. 11 is a cross-sectional view of the insulating layer 170 after being formed on the isolation layer 140 and the redistribution layer 160 shown in FIG. 10. As shown in FIG. 10 and FIG. 11, after the structure of FIG. 10 is formed, the insulating layer 170 may be formed on the third surface 141 of the isolation layer 140 and the redistribution layer 160. Thereafter, the insulating layer 170 may be patterned to form the opening 172, such that a portion of the redistribution layer 160 can be exposed through the opening 172 of the insulating layer 170.

Figure 12:
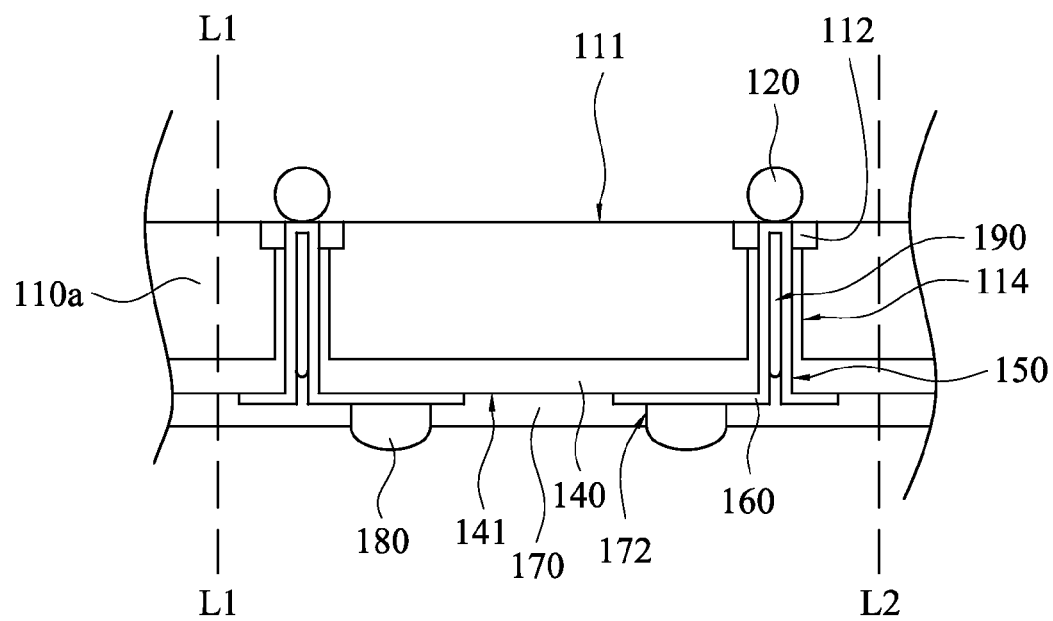
FIG. 12 is a cross-sectional view of a conductive structure after being formed on the redistribution layer shown in FIG. 11.

FIG. 12 is a cross-sectional view of the conductive structure 180 after being formed on the redistribution layer 160 shown in FIG. 11. As shown in FIG. 11 and FIG. 12, after the opening 172 of the insulating layer 170 is formed, the conductive structure 180 may be formed on the redistribution layer 160 that is in the opening 172, such that the conductive structure 180 can be electrically connected to the conductive pad 112 through the redistribution layer 160. After this step, the support element 210 on the first surface 111 of the wafer 110a may be removed.

Finally, the wafer 110a, the isolation layer 140, and the insulating layer 170 may be cut along lines L1, L2 to form the chip package 100 shown in FIG. 2.

The chip package and the manufacturing method thereof in the present invention can omit a typical chemical vapor deposition (CVD) process and a typical pattering process for the isolation layer, thereby saving process time and reducing the cost of equipments. Moreover, no additional process is performed on the first surface of the chip, so that the flatness of the first surface of the chip is good, and the detecting accuracy of the chip package can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising:
   a chip having a conductive pad, a first surface, and a second surface opposite to the first surface, wherein the conductive pad is located on the first surface, and the second surface has a first through hole to expose the conductive pad;
   a laser stopper located on the conductive pad;
   an isolation layer located on the second surface and in the first though hole, and having a third surface opposite to the second surface, wherein the isolation layer and the conductive pad have a second though hole together, such that the laser stopper is exposed through the second though hole;
   a redistribution layer located on the third surface, a sidewall of the second though hole, and the laser stopper that is in the second though hole;
   an insulating layer located on the third surface and the redistribution layer, and having an opening for exposing the redistribution layer; and
   a conductive structure located on the redistribution layer that is in the opening of the insulating layer, such that the conductive structure is electrically connected to the conductive pad.

2. The chip package of claim 1, wherein the laser stopper is made of a material comprising gold.

3. The chip package of claim 1, wherein a diameter of the second though hole is smaller than that of the first though hole.

4. The chip package of claim 1, having a cavity between the insulating layer and the redistribution layer that is in the second though hole.

5. The chip package of claim 1, wherein the sidewall of the second though hole is a rough surface.

6. The chip package of claim 1, wherein the laser stopper has a fourth surface that faces the redistribution layer, and the fourth surface is a rough surface.

7. The chip package of claim 1, wherein a thickness of the redistribution layer on the third surface of the isolation layer is greater than a thickness of the redistribution layer on the sidewall of the second though hole.

8. The chip package of claim 1, wherein a thickness of the redistribution layer on the sidewall of the second though hole is greater than a thickness of the redistribution layer on the laser stopper.

9. The chip package of claim 1, wherein the isolation layer is made of a material comprising epoxy.

\* \* \* \* \*